United States Patent
Nakajima

(10) Patent No.: US 8,786,029 B2
(45) Date of Patent: Jul. 22, 2014

(54) SEMICONDUCTOR DEVICE AND MANUFACTURING METHOD THEREOF

(75) Inventor: Toshio Nakajima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/565,026

(22) Filed: Aug. 2, 2012

(65) Prior Publication Data

US 2013/0032896 A1 Feb. 7, 2013

(30) Foreign Application Priority Data

Aug. 3, 2011 (JP) ................................. 2011-170355

(51) Int. Cl.
*H01L 21/336* (2006.01)
*H01L 29/772* (2006.01)

(52) U.S. Cl.
USPC ............. 257/409; 257/E21.409; 257/E29.255

(58) Field of Classification Search
USPC ........................... 257/409, E21.409, E29.255
See application file for complete search history.

(56) References Cited

U.S. PATENT DOCUMENTS

2013/0221430 A1* 8/2013 Yilmaz et al. ................ 257/330

FOREIGN PATENT DOCUMENTS

JP 2009-231308 A 10/2009

* cited by examiner

*Primary Examiner* — David S Blum
(74) *Attorney, Agent, or Firm* — Rabin & Berdo, P.C.

(57) ABSTRACT

A semiconductor device includes a p-type semiconductor layer, n-type column regions formed of columnar thermal donors exhibiting an n-type property, a p-type column region interposed between the n-type column regions, the n-type column regions configured to form a super-junction structure in cooperation with the p-type column region, a channel region formed in the semiconductor layer, a source region formed in the channel region, a gate insulator film formed on the semiconductor layer, and a gate electrode formed on the gate insulator film and opposite to the channel region across the gate insulator film.

8 Claims, 15 Drawing Sheets

Stripe

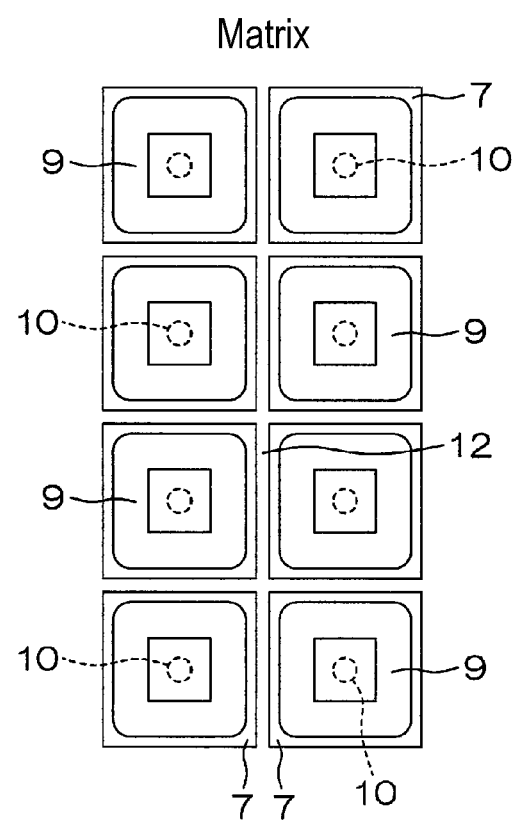

Zigzag

The magnitude of the specific resistance is the value relative to the specific resistance of the epitaxial layer before irradiation of the H+ particles.

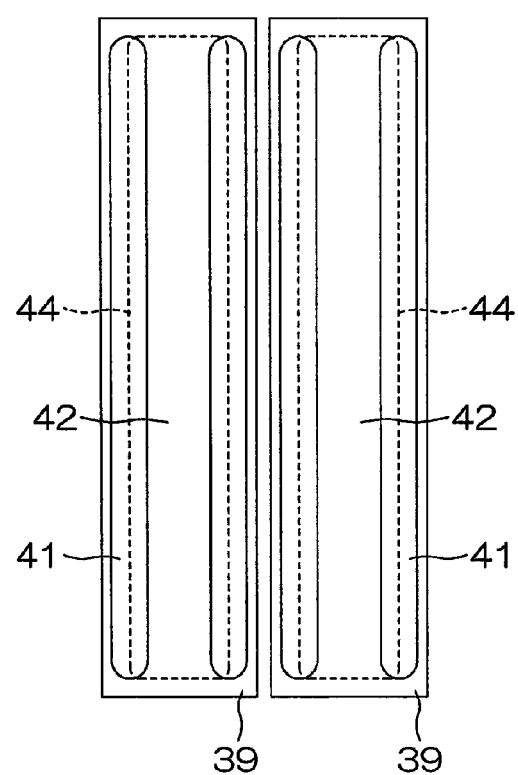

Matrix

Zigzag

SEMICONDUCTOR DEVICE AND MANUFACTURING METHOD THEREOF

CROSS-REFERENCE TO RELATED APPLICATION(S)

This application is based upon and claims the benefit of priority from Japanese Patent Application No. 2011-170355, filed on Aug. 3, 2011, the entire contents of which are incorporated herein by reference.

TECHNICAL FIELD

The present disclosure relates to a semiconductor device having a super-junction structure and a manufacturing method thereof.

BACKGROUND

Conventionally, a super-junction structure is known as a structure for reducing the on-resistance without sacrificing the breakdown voltage of a MOSFET (Metal Oxide Semiconductor Field Effect Transistor). Additionally, in the related art, there is known a super-junction structure which is formed by dry-etching an n-type silicon monocrystalline substrate to form stripe-shaped trenches on the substrate at a specified interval and then filling the insides of the trenches with filler epitaxial layers made of p-type silicon monocrystals.

SUMMARY

The present disclosure provides a semiconductor device, including: a p-type semiconductor layer; n-type column regions arranged in a mutually spaced-apart relationship along a predetermined direction parallel to a front surface of the semiconductor layer, each of the n-type column regions formed of a plurality of columnar thermal donors exhibiting an n-type property; a p-type column region of the semiconductor layer interposed between the n-type column regions adjoining to each other, the n-type column regions configured to form a super-junction structure in the semiconductor layer in cooperation with the p-type column region; an n-type channel region selectively formed in a front surface portion of the semiconductor layer to make up a portion of the front surface of the semiconductor layer; a source region selectively formed in a front surface portion of the channel region to make up a portion of the front surface of the semiconductor layer, a conductivity type of the source region being opposite to that of the channel region; a gate insulator film formed on the front surface of the semiconductor layer; and a gate electrode formed on the gate insulator film and opposite to the channel region across the gate insulator film.

With this configuration, the columnar n-type column regions and the p-type column region extending in the thickness direction of the semiconductor layer are arranged along the predetermined direction parallel to the front surface of the semiconductor layer, thereby forming a super-junction structure. With this super-junction structure, a depletion layer can be formed over the entire interface between the n-type column region and the p-type column region to extend along the interface (namely, in the thickness direction of the semiconductor layer). As a result, it is possible to prevent local concentration of electric fields in the semiconductor layer, making it possible to reduce the on-resistance of the semiconductor device and to increase the breakdown voltage of the semiconductor device.

In the present semiconductor device, the n-type column regions are formed of thermal donors. The thermal donors can be easily formed in the portions of the p-type semiconductor layer irradiated with $H^+$ particles by selectively irradiating $H^+$ particles on the portions of the semiconductor layer in which the thermal donors are to be formed and then subjecting the irradiated portions to annealing. Therefore, as compared with the related art, it is possible to form a super-junction structure in a short period of time and at low cost.

The regions in which the thermal donors are formed are determined by the stop positions of the injected $H^+$ particles. Even if the annealing is performed afterwards, the regions are not widened beyond the stop positions of the $H^+$ particles decided through the control of irradiation energy of the $H^+$ particles. As a result, the range of the n-type column regions can be determined precisely by controlling the irradiation energy of the $H^+$ particles. This makes it possible to form the n-type column regions as designed. Therefore, the super-junction structure can be easily incorporated into a MOSFET of basic structure without having to change the basic MOS structure and without affecting the MOS structure. Due to the fact that the n-type column regions can be formed as designed, it is possible to prevent variations in specific resistance among the n-type column regions and to easily miniaturize the n-type column regions. This helps miniaturize the semiconductor device.

In contrast, the conventional method of forming a super-junction structure suffers from a number of problems. For example, there is available a method in which a super-junction structure is formed by forming a trench in an n-type substrate and forming a p-type epitaxial layer inside the trench. In this method, it is difficult to uniformly control the depth of the trench by etching. This poses a problem in that variations are generated in the specific resistance of the p-type epitaxial layer filled in the trench.

There is also available a method of forming a super-junction structure in which a step of injecting p-type impurities into the front surface of an n-type substrate (epitaxial layer) and a step of causing an n-type epitaxial layer to grow after the injection of impurities are alternately performed a plural number of times to thereby form plural stages of p-type portions in the thickness direction of the n-type epitaxial layer. The plural stages of p-type portions are activated by annealing, whereby all of the p-type portions are unified to form a super-junction structure. In this method, it is necessary to alternately perform the impurity injection steps and the epitaxial growth steps a number of times. This poses a problem in that the process time becomes longer, thus leading to increased cost. In addition, the unified p-type regions cannot be determined by the stop positions of the injected p-type impurities. In other words, the p-type impurities activated by annealing are isotropically diffused with no regularity. This diffusion makes it difficult to control the shape of the finally-formed p-type regions.

The two conventional methods stated above have a common problem in that the super-junction structure has to be formed prior to forming the MOS structure. Therefore, if the depth of the trench or the diffusion range of the p-type impurities differs from the designed one, the MOS structure formed thereafter has to be changed from the previously-designed structure. According to the present semiconductor device, as a means for solving the problems noted above, the n-type column regions are formed by thermal donors. As compared with the related art, it is therefore possible to easily form a super-junction structure as designed in a short period of time and at low cost.

In the present semiconductor device, the n-type column regions have a specific resistance of, e.g., from 1.0 Ω·cm to 10.0 Ω·cm. The present semiconductor device may employ any one of a p-channel MOSFET and an n-channel MOSFET. In the present semiconductor device, the channel region may be an n-type and the source region may be a p-type. The present semiconductor device may further include: a p-channel MOSFET configured to induce a channel between the p-type source region and the p-type column region by applying a voltage to the gate electrode.

In this case, the semiconductor layer may include a p-type base region formed in the direction of a rear surface of the semiconductor layer with respect to the n-type column regions and the p-type column region so as to extend below the n-type column regions and the p-type column region along the predetermined direction parallel to the front surface of the semiconductor layer. Accordingly, if a source voltage is applied between the source region and the base region (between the source and the drain) and a specified voltage is applied to the gate electrode in a state where the p-type base region (drain region) is grounded (namely, the p-type base region is kept at 0 V), it is possible to cause an electric current to flow from the source region toward the base region through the p-type column region in the thickness direction of the semiconductor layer (in the vertical direction).

The p-channel MOSFET may be manufactured by, e.g., a semiconductor device manufacturing method, including: preparing a p-type semiconductor layer; forming an n-type channel region in a front surface portion of the p-type semiconductor layer by selectively injecting an n-type impurity into a front surface of the semiconductor layer and activating the n-type impurity through annealing, the n-type channel region making up a portion of the front surface of the semiconductor layer; forming a p-type source region in a front surface portion of the channel region by selectively injecting a p-type impurity into the front surface of the semiconductor layer and activating the p-type impurity through annealing, the p-type source region making up a portion of the front surface of the semiconductor layer; forming a gate insulator film on the surface of the semiconductor layer; forming a gate electrode on the gate insulator film, the gate electrode opposite to a portion of the channel region across the gate insulator film; and after formation of the gate electrode, forming n-type column regions made of columnar thermal donors exhibiting an n-type property by selectively irradiating H$^+$ particles on a plurality of portions of the semiconductor layer mutually spaced apart along a predetermined direction parallel to the front surface of the semiconductor layer and inverting a conductivity type of the portions of the semiconductor layer irradiated with the H$^+$ particles through annealing, and, at the same time, forming p-type column regions having the same conductivity type as the conductivity type of the semiconductor layer in portions interposed between the n-type column regions adjoining to each other.

On the other hand, in the present semiconductor device, the channel region may be a p-type and the source region may be an n-type. The present semiconductor device may further include: an n-channel MOSFET configured to induce a channel between the n-type source region and the n-type column region by applying a voltage to the gate electrode. In this case, the semiconductor layer may include an n-type base region formed in the direction of a rear surface of the semiconductor layer with respect to the n-type column regions and the p-type column region so as to extend below the n-type column regions and the p-type column region along the predetermined direction parallel to the front surface of the semiconductor layer. Accordingly, if a drain voltage is applied to between the source region and the n-type base region (drain region) (between the source and the drain) and a specified voltage is applied to the gate electrode in a state where the n-type source region is grounded (namely, the n-type source region is kept at 0 V), it is possible to cause an electric current to flow from the base region toward the source region through the n-type column region in the thickness direction of the semiconductor layer (in the vertical direction).

The n-channel MOSFET may be manufactured by, e.g., a semiconductor device manufacturing method, including: preparing a p-type semiconductor layer; forming an n-type source region in a front surface portion of the p-type semiconductor layer by selectively injecting an n-type impurity into a front surface of the semiconductor layer and activating the n-type impurity through annealing, the n-type source region making up a portion of the front surface of the semiconductor layer; forming a gate insulator film on the surface of the semiconductor layer; forming a gate electrode on the gate insulator film; and after formation of the gate electrode, forming n-type column regions made of columnar thermal donors exhibiting an n-type property by selectively irradiating H$^+$ particles on a plurality of portions of the semiconductor layer mutually spaced apart along a predetermined direction parallel to the front surface of the semiconductor layer and inverting a conductivity type of the portions of the semiconductor layer irradiated with the H$^+$ particles through annealing, and, at the same time, forming a p-type channel region making up a portion of the front surface of the semiconductor layer in a portion interposed between the n-type column regions adjoining to each other so that the channel region can be partially opposite to the gate electrode across the gate insulator film and forming a p-type column regions below the channel region.

In the present semiconductor device, the n-type column region may be a region formed in the direction of the rear surface of the semiconductor layer with respect to the channel region so as to make contact with the channel region. Alternatively, the n-type column region may be a region formed in the direction of the rear surface of the semiconductor layer with respect to the channel region in a spaced-apart relationship with the channel region. Additionally, in the present semiconductor device manufacturing method, the annealing for the formation of thermal donors may be performed at a temperature of from 400 degrees C. to 450 degrees C.

The specific resistance of the n-type column regions made of thermal donors grows smaller when the temperature increases until the annealing temperature reaches 450 degrees C. or so. The specific resistance becomes smallest at about 450 degrees C. Thereafter, if the temperature exceeds 450 degrees C., the specific resistance grows larger as the temperature increases and finally approaches the specific resistance of the semiconductor layer available before the irradiation of H$^+$ particles. In view of this, annealing is performed at a temperature of from 400 degrees C. to 450 degrees C. in the present disclosure. This makes it possible to reduce the specific resistance of the n-type column regions and to further reduce the on-resistance.

BRIEF DESCRIPTION OF THE DRAWINGS

FIGS. 2A, 2B and 2C are layout diagrams of n-type channel regions of the semiconductor device shown in FIG. 1, FIG. 2A showing a stripe pattern, FIG. 2B showing a matrix pattern and FIG. 2C showing a zigzag pattern.

FIGS. 6A, 6B and 6C are layout diagrams of p$^-$-type channel regions of the semiconductor device shown in FIG. 5, FIG. 6A showing a stripe pattern, FIG. 6B showing a matrix pattern and FIG. 6C showing a zigzag pattern.

DETAILED DESCRIPTION

Certain embodiment of the present disclosure will now be described in detail with reference to the accompanying drawings.

Embodiment of p-Channel MOSFET

First Embodiment

Figure 1:
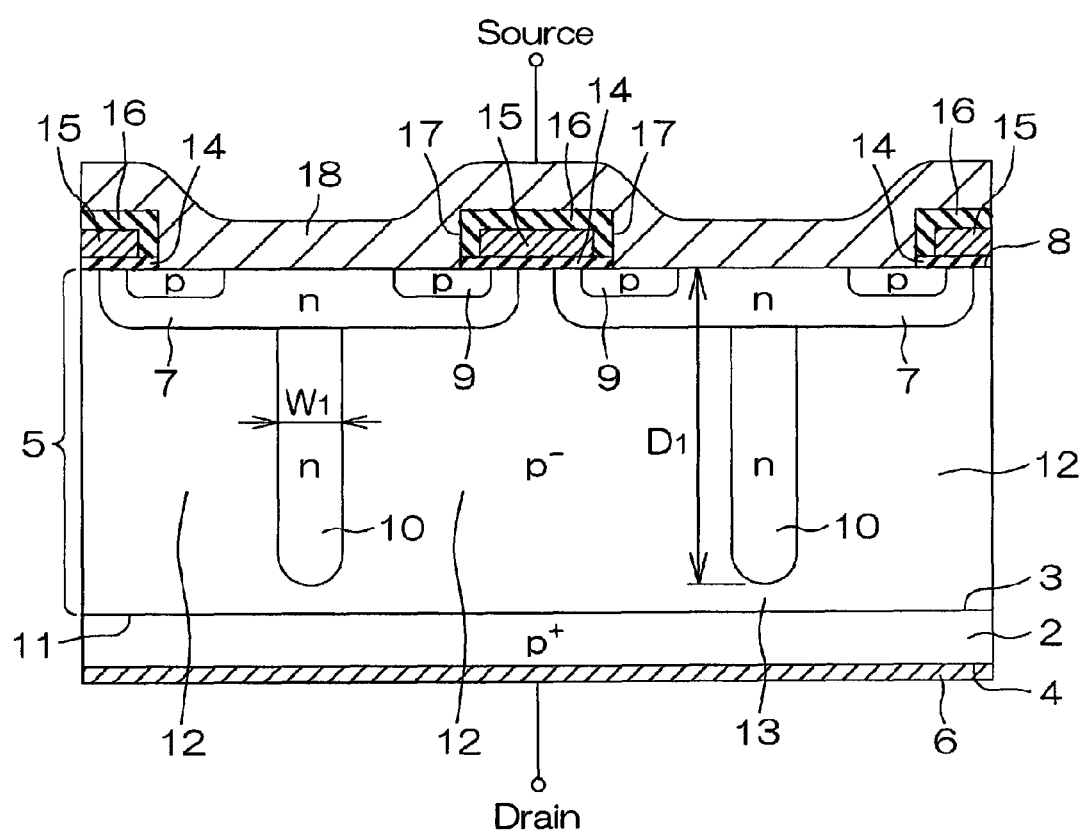
FIG. 1 is a schematic section view showing a semiconductor device (p-channel MOSFET) according to a first embodiment of the present disclosure.
Figure 2A:
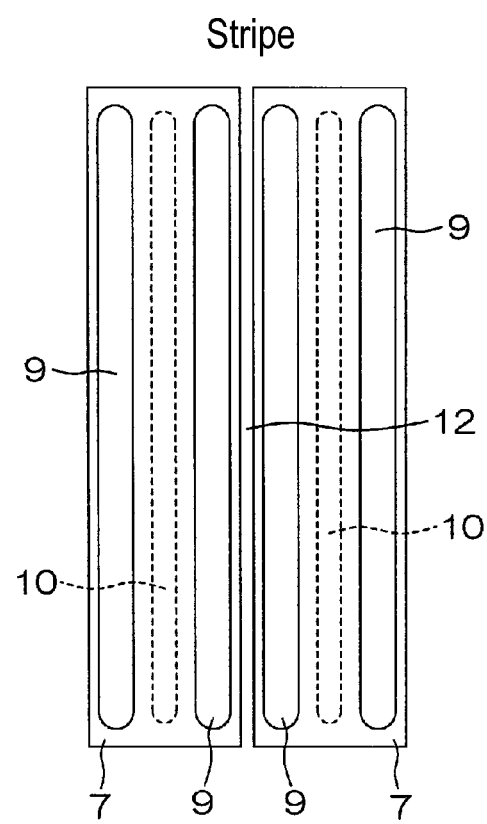
Figure 2C:
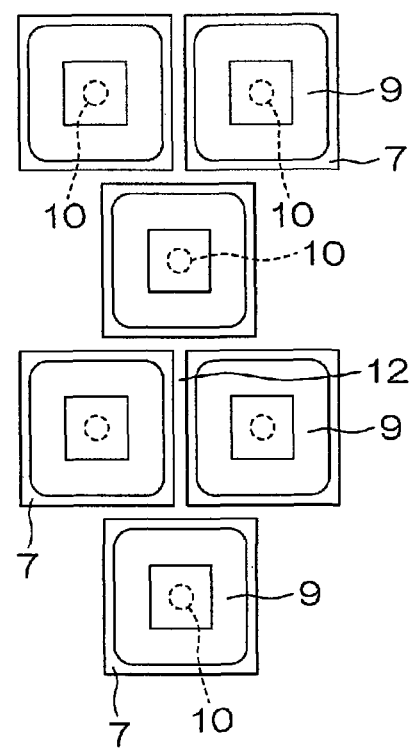

FIG. 1 is a schematic section view showing a semiconductor device 1 (p-channel MOSFET) according to a first embodiment of the present disclosure. FIGS. 2A, 2B and 2C are layout diagrams of n-type channel regions 7 of the semiconductor device 1, FIG. 2A showing a stripe pattern, FIG. 2B showing a matrix pattern and FIG. 2C showing a zigzag pattern.

The semiconductor device 1 includes a substrate 2 (having a thickness of, e.g., from 100 μm to 700 μm) of p$^+$-type silicon (having an acceptor concentration of, e.g., from $10^{17}$ to $10^{19}$ atoms·cm$^{-3}$). An epitaxial layer 5 (semiconductor layer) made of p$^-$-type silicon (having an acceptor concentration of, e.g., from $10^{15}$ to $10^{16}$ atoms·cm$^{-3}$) is formed on a front surface 3 of the silicon substrate 2. The acceptor concentration of the epitaxial layer 5 is lower than that of the silicon substrate 2. The thickness of the epitaxial layer 5 is, e.g., from 10 μm to 80 μm. A drain electrode 6 is formed on a rear surface 4 of the silicon substrate 2. The drain electrode 6 is made of a metallic material, e.g., Au (gold).

A plurality of n-type channel regions 7 (having an acceptor concentration of, e.g., from $10^{15}$ to $10^{16}$ atoms·cm$^{-3}$) is formed in a front surface portion of the epitaxial layer 5. Each of the channel regions 7 makes up a portion of a front surface 8 of the epitaxial layer 5 (namely, the channel regions 7 are exposed at the front surface 8 of the epitaxial layer 5). As shown in FIG. 2A, the n-type channel regions 7 are formed into a stripe pattern (extending in a direction perpendicular to FIG. 1) in which the channel regions 7 are arranged at a specified pitch. The layout of the n-type channel regions 7 is not limited to a stripe pattern but may be a matrix pattern (row-column pattern) in which the channel regions 7 are arranged at a specified pitch in a row direction and a column direction, as shown in FIG. 2B, or a zigzag pattern in which the channel regions 7 are alternately arranged in the column direction, as shown in FIG. 2C.

P-type source regions 9 are formed in each of the n-type channel regions 7 at opposing end portions in the traverse direction orthogonal to the longitudinal direction (stripe direction) of the n-type channel regions 7 in a spaced-apart relationship with the peripheral edge defining each of the n-type channel regions 7. Each of the p-type source regions 9 makes up a portion of the front surface 8 of the epitaxial layer 5. The p-type source regions 9 are linearly formed to extend parallel to one another in the longitudinal direction. In the case of the matrix pattern shown in FIG. 2B or the zigzag pattern shown in FIG. 2C, each of the p-type source regions 9 may be formed into, e.g., a ring shape, to extend along the peripheral edge of each of the n-type channel regions 7 in a spaced-apart relationship with the peripheral edge.

N-type column regions 10 are formed in the epitaxial layer 5 below the n-type channel regions 7. The n-type column regions 10 are formed in areas of the epitaxial layer 5 other than the areas directly below the p-type source regions 9. For example, if the n-type channel regions 7 have the stripe pattern as shown in FIG. 2A, each of the n-type column regions 10 is formed into a laminar shape (column shape in a section view) to extend through the epitaxial layer 5 from the front surface 8 toward a rear surface 11 of the epitaxial layer 5 in the areas below the central portion of each of the n-type channel regions 7 interposed between the linear p-type source regions 9. The width $W_1$ of each of the n-type column regions 10 in the transverse direction of the n-type channel regions 7 is, e.g., from 2 μm to 8 μm. In the present embodiment, the n-type column regions 10 are formed to make contact with the n-type channel regions 7.

In the semiconductor device 1, the n-type column regions 10 are formed of thermal donors. The thermal donors refer to the portions in which oxygen atoms and holes in the Si crystals are turned into donors when the epitaxial layer 5 (Si crystals) containing oxygen atoms is subjected to annealing at about 450 degrees C. The thermal donors exhibit an n-type property in the p-type silicon. The existence of the thermal donors can be observed by, e.g., ESR (Electron Paramagnetic Resonance). The specific resistance of the n-type column regions 10 formed of the thermal donors is, e.g., from 2 Ω·cm to 8 Ω·cm.

By forming the laminar n-type column regions 10, a super-junction structure is formed in the epitaxial layer 5. In the super-junction structure, the laminar n-type column regions 10 arranged at an appropriate pitch and laminar p$^-$-type column regions 12 having the same conductivity type as that of the epitaxial layer 5 are alternately arranged along a predetermined direction parallel to the front surface 8 of the epitaxial layer 5.

The region of the epitaxial layer 5 existing in the direction of the silicon substrate 2 with respect to the n-type column regions 10 and the p$^-$-type column regions 12 and making contact with the front surface 3 of the silicon substrate 2 is a p$^-$-type base region 13. The p$^-$-type base region 13 extends below the n-type column regions 10 and the p$^-$-type column regions 12 in parallel with the front surface 8 of the epitaxial layer 5. The p$^-$-type base region 13 existing between the n-type column regions 10 and the p$^+$-type silicon substrate 2 prevents the n-type column regions 10 and the p+-type silicon substrate 2 from making contact with each other. The depth $D_1$ of the n-type column regions 10 (the distance from the front surface 8 of the epitaxial layer 5 to the deepest portion of the n-type column regions 10) is, e.g., from 25 μm to 70 μm. The deepest portion of the n-type column regions 10 is located at positions spaced from the front surface 3 of the silicon substrate 2.

In the case where the n-type channel regions 7 have a matrix pattern, as shown in FIG. 2B, or a zigzag pattern, as shown in FIG. 2C, each of the n-type column regions 10 may be formed in the area below the central portion of each of the n-type channel regions 7 surrounded by each of the ring-shaped p-type source regions 9 so as to have a column shape extending from each of the n-type channel regions 7 toward the silicon substrate 2.

On the front surface 8 of the epitaxial layer 5, there is formed a gate insulator film 14 made of, e.g., $SiO_2$ (silicon oxide). A gate electrode 15 is formed on the gate insulator film 14.

The gate electrode 15 is formed into a stripe shape to extend along the n-type channel regions 7 having a stripe shape. The gate electrode 15 is opposite to, across the gate insulator film 14, a portion of each of the n-type channel regions 7 exposed between the peripheral edge of each of the n-type channel regions 7 and a p-type source region 9. The gate electrode 15 is made of, e.g., polysilicon containing an impurity at a high concentration. In the event that the n-type channel regions 7 have the matrix pattern as shown in FIG. 2B, the gate electrode 15 may be formed into a lattice shape so as to surround each of the n-type channel regions 7.

An inter-layer insulator film 16 made of, e.g., $SiO_2$, is formed on the epitaxial layer 5 so as to cover the gate electrode 15. A plurality of contact holes 17 is formed in the inter-layer insulator film 16 and the gate insulator film 14. Each of the p-type source regions 9 and each of the n-type channel regions 7 are partially exposed in each of the contact holes 17. A source electrode 18 is formed on the inter-layer insulator film 16. The source electrode 18 makes contact with all of the p-type source regions 9 and all of the n-type channel regions 7 through each of the contact hole 17. In other words, the source electrode 18 serves as a common wiring line with respect to all of the unit cells. The source electrode 18 is made of a metallic material, e.g., Al (aluminum).

Figure 3A:
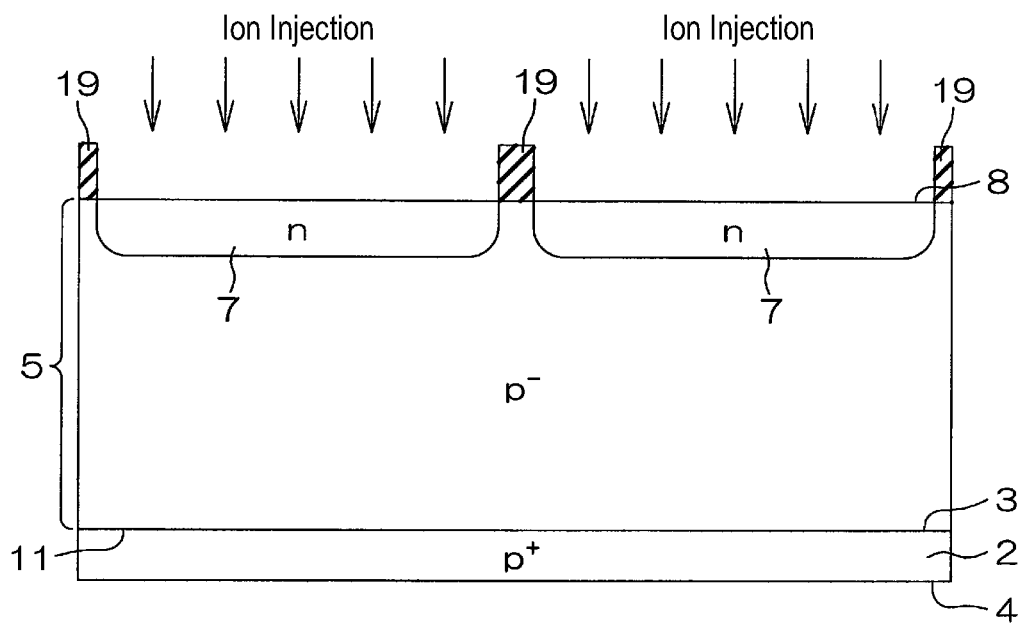
FIG. 3A is a view illustrating a step of a process for manufacturing the semiconductor device shown in FIG. 1.

FIGS. 3A through 3E are views showing steps of a process for manufacturing the semiconductor device 1 shown in FIG. 1. In order to manufacture the semiconductor device 1, as shown in FIG. 3A, Si crystals are caused to grow on the front surface 3 of the silicon substrate 2 by an epitaxial growth method such as CVD (Chemical Vapor Deposition), LPE (Liquid Phase Epitaxy) or MBE (Molecular Beam Epitaxy), while injecting a p-type impurity, e.g., B (boron). As a result, a p−-type epitaxial layer 5 is formed on the silicon substrate 2.

Next, a hard mask 19 is formed so as to selectively cover the portions of the epitaxial layer 5 other than the portions in which the n-type channel regions 7 are to be formed. Then, an n-type impurity, e.g., P (phosphor), is accelerated toward the front surface 8 of the epitaxial layer 5 exposed from the hard mask 19, thereby injecting the n-type impurity into the front surface 8 (ion injection). Subsequently, the epitaxial layer 5 is subjected to annealing at a temperature of, e.g., from 1000 degrees C. to 1150 degrees C. Thus, the n-type impurity injected into the front surface 8 of the epitaxial layer 5 is activated to form the n-type channel regions 7.

Figure 3B:
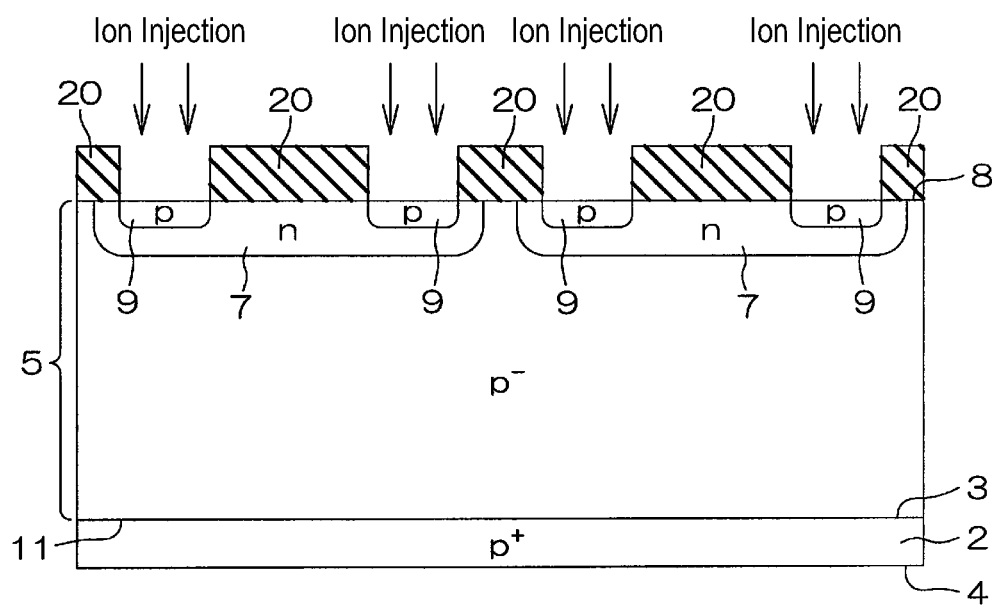
FIG. 3B is a view illustrating a step subsequent to the step shown in FIG. 3A.

Next, as shown in FIG. 3B, a hard mask 20 is formed so as to selectively cover the portions of the epitaxial layer 5 other than the portions in which the p-type source regions 9 are to be formed. Then, a p-type impurity is accelerated toward the front surface 8 of the epitaxial layer 5 exposed from the hard mask 20, thereby injecting the p-type impurity into the front surface 8 (ion injection). Subsequently, the epitaxial layer 5 is subjected to annealing at a temperature of, e.g., from 800 degrees C. to 950 degrees C. Thus, the p-type impurity injected into the front surface 8 of the epitaxial layer 5 is activated to form the p-type source regions 9.

Figure 3C:
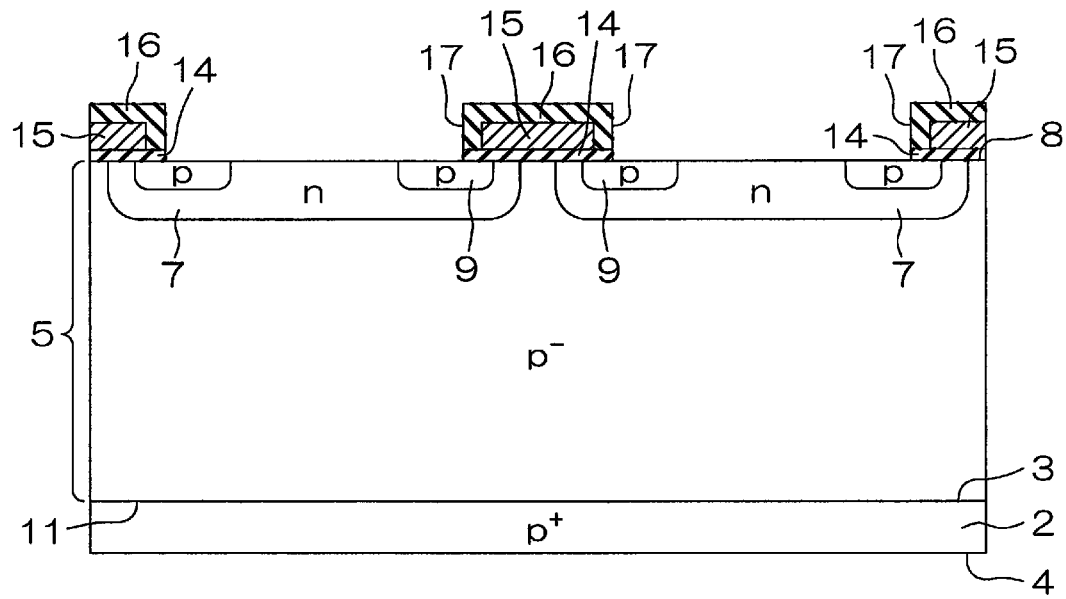
FIG. 3C is a view illustrating a step subsequent to the step shown in FIG. 3B.

Next, as shown in FIG. 3C, the front surface 8 of the epitaxial layer 5 is subjected to thermal oxidation at a temperature of, e.g., from 800 degrees C. to 1080 degrees C., thereby forming a gate insulator film 14 that covers the entirety of the front surface 8 of the epitaxial layer 5. Then, polysilicon is deposited on the epitaxial layer 5 by, e.g., CVD, while injecting an impurity (any one of n-type and p-type impurities). Thereafter, unnecessary portions of the deposited polysilicon (other than the portions to become the gate electrodes 15) are removed by dry etching, thereby forming the gate electrodes 15.

Subsequently, an inter-layer insulator film 16 made of, e.g., $SiO_2$ is deposited on the epitaxial layer 5 by, e.g., CVD. Contact holes 17 are formed by simultaneously patterning the inter-layer insulator film 16 and the gate insulator film 14.

Figure 3D:
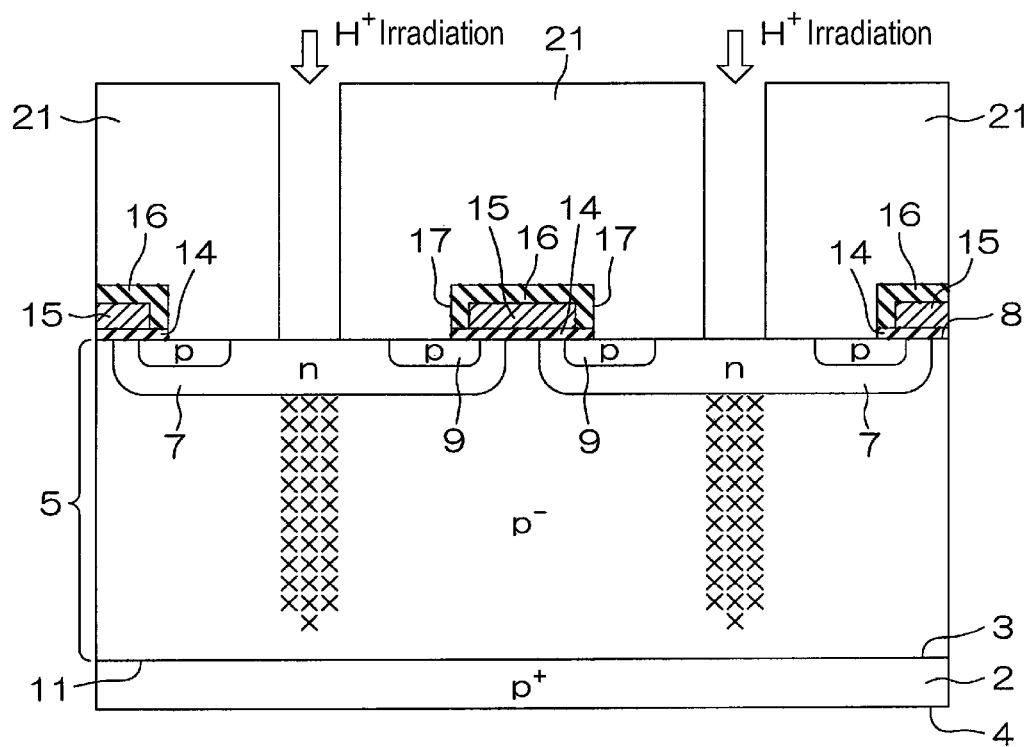
FIG. 3D is a view illustrating a step subsequent to the step shown in FIG. 3C.

Next, as shown in FIG. 3D, a thick resist mask 21 (having a thickness of, e.g., from 5 μm to 20 μm) made of a photoresist is formed so as to selectively cover the portions of the epitaxial layer 5 other than the portions in which the n-type column regions 10 are to be formed. Then, H− particles are accelerated toward the front surface 8 of the epitaxial layer 5 exposed from the resist mask 21, thereby irradiating H− particles on the front surface 8 (H+ irradiation). The H+ irradiation is performed in multiple stages while changing the acceleration energy of the H+ particles in a step-by-step manner. For example, the H+ irradiation may be performed between 5 MeV and 10 MeV, while reducing the energy from a high level to a low level in a step-by-step manner (in two through five steps). This makes it possible to irradiate H− particles into the area extending from a bottom portion to a front surface portion of the epitaxial layer 5. After the H+ irradiation, the thick resist mask 21 is peeled off.

Figure 3E:
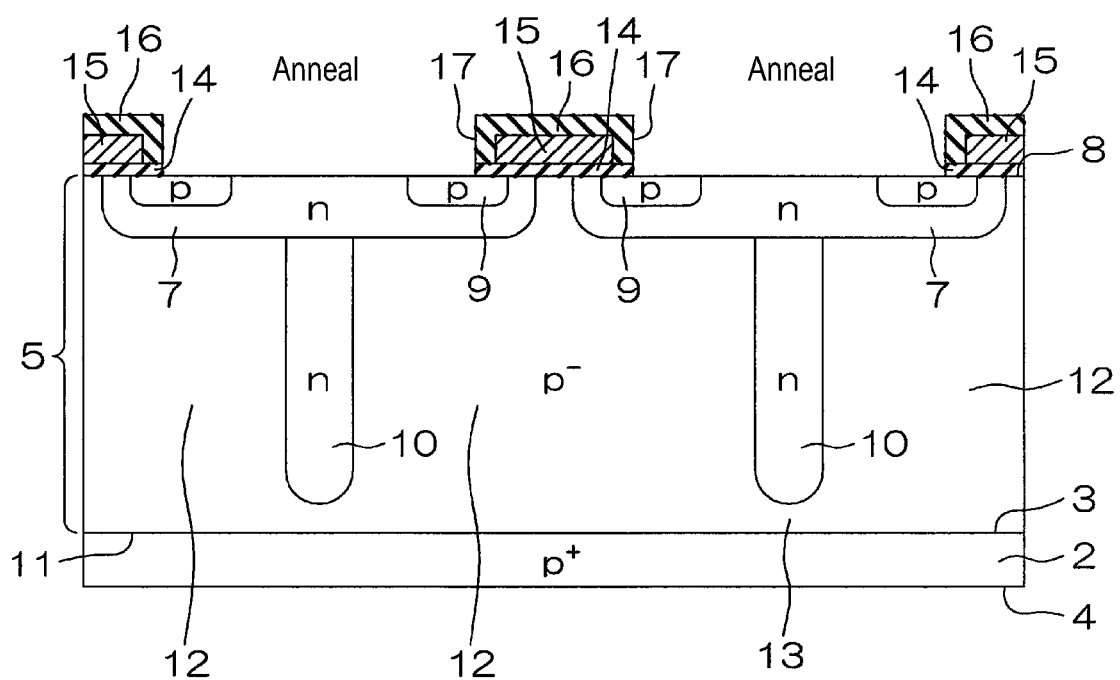
FIG. 3E is a view illustrating a step subsequent to the step shown in FIG. 3D.

Next, as shown in FIG. 3E, the epitaxial layer 5 is subjected to annealing at a temperature of, e.g., from 400 degrees C. to 450 degrees C. Thus, the H− particles included in the epitaxial layer 5 by the H+ irradiation become promoters, thereby turning the oxygen atoms and holes in the epitaxial layer 5 (Si crystals) into donors. The portions irradiated with the H+ particles become thermal donors exhibiting an n-type property. As a result, there are formed n-type column regions 10 made of the thermal donors. At the same time, there are formed p−-type column regions 12 and a p−-type base region 13 having the same conductivity type (p−-type) as that of the epitaxial layer 5.

Thereafter, a source electrode 18 is formed by depositing Al (metallic material) at a sputtering temperature of, e.g., 500 degrees C. to 600 degrees C. A drain electrode 6 is formed by depositing Au (metallic material) at a sputtering temperature of, e.g., 380 degrees C. to 420 degrees C. The semiconductor device 1 shown in FIG. 1 is obtained through the steps set forth above.

In the semiconductor device 1 (p-channel MOSFET), if a source voltage is applied between the source electrode 18 and the drain electrode 6 (between the source and the drain), and a specified voltage is applied to the gate electrodes 15 in a state where the drain electrode 6 is grounded (namely, the p−-type base region 13 is kept at 0 V), it is possible to cause an electric current to flow from the p-type source regions 9 toward the p⁻-type base region 13 through the p⁻-type column regions 12 in the thickness direction of the epitaxial layer 5 (in the vertical direction).

According to the semiconductor device 1 described above, the columnar n-type column regions 10 and the p⁻-type column regions 12 extending in the thickness direction of the epitaxial layer 5 are alternately arranged along a direction parallel to the front surface 8 of the epitaxial layer 5, thereby forming a super-junction structure. With this super-junction structure, a depletion layer can be formed over the entire interface between the columnar n-type column region 10 and the p⁻-type column region 12 to extend along the direction of the interface (namely, in the thickness direction of the epitaxial layer 5). As a result, it is possible to prevent local concentration of electric fields in the epitaxial layer 5, making it possible to reduce the on-resistance of the semiconductor device 1 and to increase the breakdown voltage of the semiconductor device 1.

In the semiconductor device 1, the n-type column regions 10 are formed of thermal donors. As set forth above, the thermal donors can be easily formed in the portions of the p⁻-type epitaxial layer 5 irradiated with H⁺ particles, by selectively irradiating H⁺ particles on the portions of the epitaxial layer 5 in which the thermal donors are to be formed (the step shown in FIG. 3D) and then subjecting the irradiated portions to annealing (the step shown in FIG. 3E). Therefore, as compared with the related art, it is possible to form a super-junction structure in a short period of time and at low cost.

The regions (the n-type column regions 10) in which the thermal donors are formed are determined by the stop positions of the injected H⁺ particles. Even if the annealing is performed afterwards, the regions (the n-type column regions 10) are not widened beyond the stop positions of the H⁺ particles decided through the control of irradiation energy of the H⁺ particles. As a result, the range of the n-type column regions 10 can be determined precisely by controlling the irradiation energy of the H⁺ particles. This makes it possible to form the n-type column regions 10 as designed. Therefore, the super-junction structure can be easily incorporated into a MOSFET of basic structure without having to change the basic MOS structure and without affecting the MOS structure. Due to the fact that the n-type column regions 10 can be formed as designed, it is possible to prevent variations in specific resistance among the n-type column regions 10 and to easily miniaturize the n-type column regions 10. This helps miniaturize the semiconductor device 1.

In contrast, the conventional method of forming a super-junction structure suffers from a number of problems. For example, there is available a method in which a super-junction structure is formed by forming a trench in an n-type substrate and forming a p-type epitaxial layer inside the trench. In this method, it is difficult to uniformly control the depth of the trench by etching. This poses a problem in that variations are generated in the specific resistance of the p-type epitaxial layer filled in the trench.

There is also available a method of forming a super-junction structure in which a step of injecting p-type impurities into the front surface of an n-type substrate (epitaxial layer) and a step of causing an n-type epitaxial layer to grow after the injection of impurities are alternately performed a plural number of times to thereby form plural stages of p-type portions in the thickness direction of the n-type epitaxial layer. The plural stages of p-type portions are activated by annealing, whereby all of the p-type portions are unified to form a super-junction structure. In this method, it is necessary to alternately perform the impurity injection steps and the epitaxial growth steps a number of times. This poses a problem in that the process time becomes longer, thus leading to increased cost. In addition, the unified p-type regions cannot be determined by the stop positions of the injected p-type impurities. In other words, the p-type impurities activated by annealing are isotropically diffused with no regularity. This diffusion makes it difficult to control the shape of the finally-formed p-type regions.

The two conventional methods stated above have a common problem in that the super-junction structure has to be formed prior to forming the MOS structure. Therefore, if the depth of the trench or the diffusion range of the p-type impurities differs from the designed one, the MOS structure formed thereafter has to be changed from the previously-designed structure.

According to the present semiconductor device 1, as a means for solving the problems noted above, the n-type column regions 10 are formed by thermal donors. As compared with the related art, it is therefore possible to easily form a super-junction structure as designed in a short period of time and at low cost.

Figure 4:
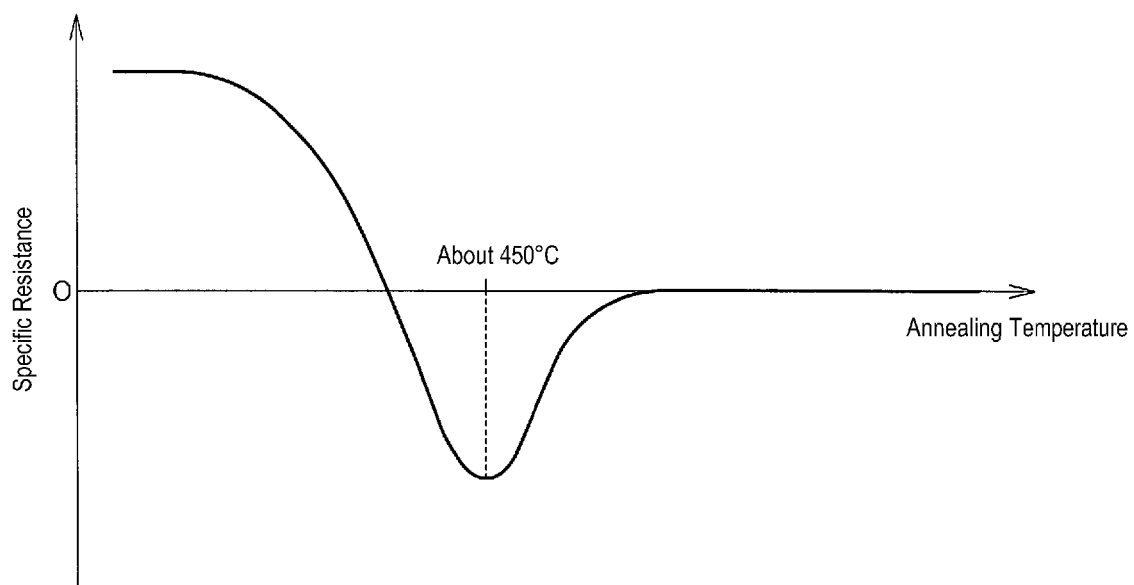
FIG. 4 is a graph representing the relationship between a specific resistance of a silicon turned into a thermal donor and an annealing temperature.

Referring to FIG. 4, the specific resistance of the n-type column regions 10 made of thermal donors grows smaller when the annealing temperature increases until the annealing temperature reaches 450 degrees C. or so. The specific resistance becomes smallest at about 450 degrees C. Thereafter, if the temperature exceeds 450 degrees C., the specific resistance grows larger as the temperature increases and finally approaches the specific resistance of the epitaxial layer 5 available before the irradiation of H⁺ particles. In view of this, annealing is performed at a temperature of from 400 degrees C. to 450 degrees C. in the step shown in FIG. 3E. This makes it possible to reduce the specific resistance of the n-type column regions 10 and to further reduce the on-resistance.

Embodiment of n-Channel MOSFET

Second Embodiment

Figure 5:
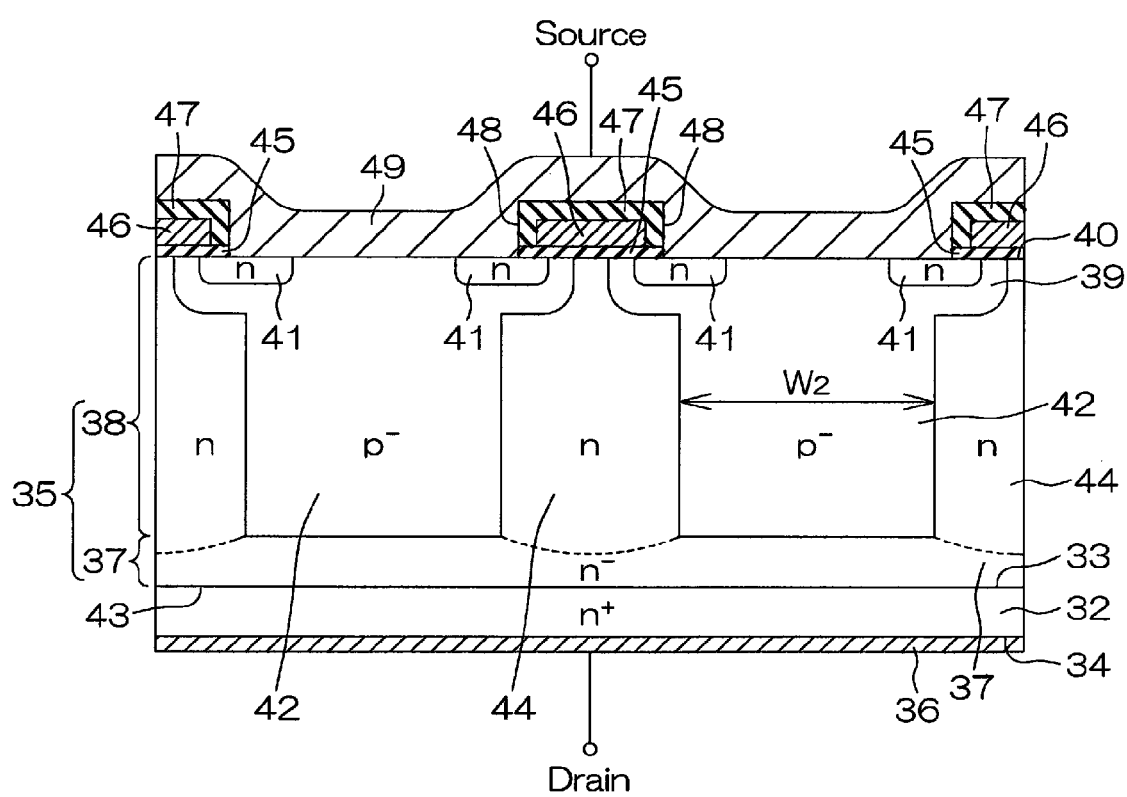
FIG. 5 is a schematic section view showing a semiconductor device (n-channel MOSFET) according to a second embodiment of the present disclosure.
Figure 6B:
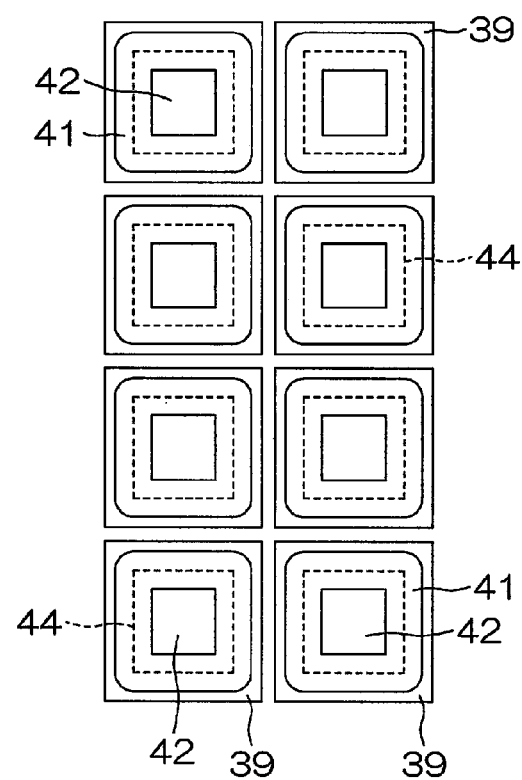
Figure 6C:
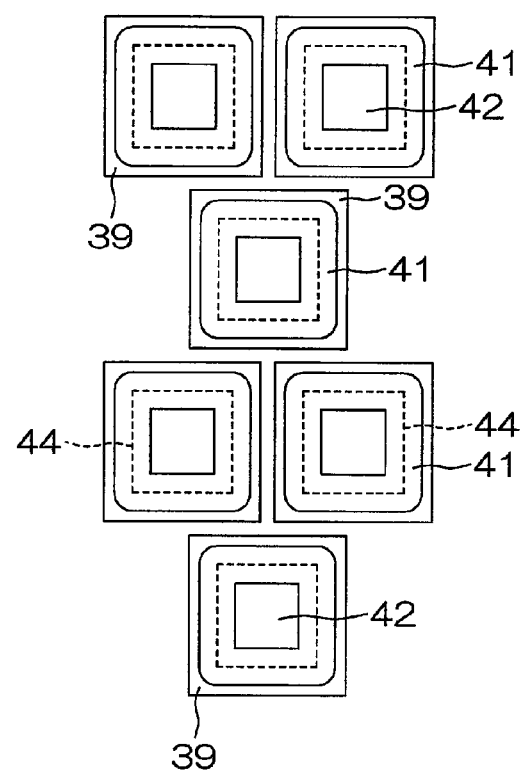

FIG. 5 is a schematic section view showing a semiconductor device 31 (n-channel MOSFET) according to a second embodiment of the present disclosure. FIGS. 6A, 6B and 6C are layout diagrams of channel regions 39 of the semiconductor device 31 shown in FIG. 5, FIG. 6A showing a stripe pattern, FIG. 6B showing a matrix pattern and FIG. 6C showing a zigzag pattern.

The semiconductor device 31 includes an n⁺-type silicon substrate 32 (having a thickness of, e.g., from 500 μm to 650 μm). An epitaxial layer 35 (semiconductor layer) made of silicon is formed on a front surface 33 of the silicon substrate 32. A drain electrode 36 is formed on a rear surface 34 of the silicon substrate 32. The drain electrode 36 is made of a metallic material, e.g., Au (gold).

The epitaxial layer 35 includes an n⁻-type base layer 37 (base region) formed to make contact with the front surface 33 of the silicon substrate 32 and having a lower concentration than the silicon substrate 32. The epitaxial layer 35 also includes a p⁻-type drift layer 38 formed on the n⁻-type base layer 37 and having a lower concentration than the silicon substrate 32. The total thickness of the epitaxial layer 35 is, e.g., from 10 μm to 80 μm. The thickness of the n⁻-type base layer 37 is smaller than the thickness of the p⁻-type drift layer 38.

A plurality of p⁻-type channel regions 39 is formed in a front surface portion of the epitaxial layer 35 (the p⁻-type drift layer 38). Each of the p⁻-type channel regions 39 makes up a portion of the front surface 40 of the epitaxial layer 35 (namely, the p⁻-type channel regions 39 are exposed at the front surface 40 of the epitaxial layer 35). As shown in FIG. 6A, the p⁻-type channel regions 39 are formed into a stripe pattern (extending in a direction perpendicular to FIG. 5) in which the p⁻-type channel regions 39 are arranged at a specified pitch. The layout of the p⁻-type channel regions 39 is not limited to a stripe pattern but may be a matrix pattern (row-column pattern) in which the p⁻-type channel regions 39 are arranged at a specified pitch in a row direction and a column direction, as shown in FIG. 6B, or a zigzag pattern in which the p⁻-type channel regions 39 are alternately arranged in the column direction, as shown in FIG. 6C.

N-type source regions 41 are formed in each of the p⁻-type channel regions 39 at opposing end portions in the traverse direction orthogonal to the longitudinal direction (stripe direction) of the p⁻-type channel regions 39 in a spaced-apart relationship with the peripheral edge defining each of the p⁻-type channel regions 39. Each of the n-type source regions 41 makes up a portion of the front surface 40 of the epitaxial layer 35. The n-type source regions 41 are linearly formed to extend parallel to one another in the longitudinal direction. In the case of the matrix pattern shown in FIG. 6B or the zigzag pattern shown in FIG. 6C, each of the n-type source regions 41 may be formed into, e.g., a ring shape, to extend along the peripheral edge of each of the p⁻-type channel regions 39 in a spaced-apart relationship with the peripheral edge.

P⁻-type column regions 42 having the same conductivity type as that of the epitaxial layer 35 are formed in the epitaxial layer 35 below the p⁻-type channel regions 39 of the epitaxial layer 35. The p⁻-type column regions 42 are formed to overlap with areas below partial portions of the n-type source regions 41 of the epitaxial layer 35. For example, if the p⁻-type channel regions 39 have the stripe pattern as shown in FIG. 6A, each of the p⁻-type column regions 42 is formed into a laminar shape (column shape in a section view) to extend through the epitaxial layer 35 from the front surface 40 toward the rear surface 43 in the areas below the partial portion of the linear n-type source regions 41 and the area below the central portion of each of the p⁻-type channel regions 39 interposed between the n-type source regions 41. The width $W_2$ of each of the p⁻-type column regions 42 in the transverse direction of the p⁻-type channel regions 39 is, e.g., from 2 μm to 8 μm. In the present embodiment, the p⁻-type column regions 42 are formed to make contact with the p⁻-type channel regions 39.

In the epitaxial layer 35, n-type column regions 44 are formed between the p⁻-type column regions 42 and are arranged at a predetermined pitch. When seen in a plan view, the n-type column regions 44 overlap with the peripheral edge portions of the p⁻-type channel regions 39. In some embodiment, the n-type column regions 44 may be formed to surround the p⁻-type column regions 42. The n-type column regions 44 are formed of thermal donors. The thermal donors refer to the portions in which oxygen atoms and holes in the Si crystals are turned into donors when the epitaxial layer 35 (Si crystals) containing oxygen atoms is subjected to annealing at about 450 degrees C. The thermal donors exhibit an n-type property in the p-type silicon. The existence of the thermal donors can be observed by, e.g., ESR or the like. The specific resistance of the n-type column regions 44 formed of the thermal donors is, e.g., from 2 Ω·cm to 8 Ω·cm.

In the semiconductor device 31, there is formed a super-junction structure in which the p⁻-type column regions 42 having the same conductivity type as that of the epitaxial layer 35, and the n-type column regions 44 interposed between the mutually-adjoining p⁻-type column regions 42 are alternately arranged along a direction parallel to the front surface 40 of the epitaxial layer 35.

The region of the epitaxial layer 35 existing in the direction of the silicon substrate 32 with respect to the n-type column regions 44 and the p⁻-type column regions 42 and making contact with the front surface 33 of the silicon substrate 32 is an n⁻-type base layer 37. The n⁻-type base layer 37 extends below the n-type column regions 44 and the p⁻-type column regions 42. The n⁻-type base layer 37 existing between the n-type column regions 44 and the n⁺-type silicon substrate 32 prevents the p⁻-type column regions 42 and the n⁺-type silicon substrate 32 from making contact with each other.

In the case where the p⁻-type channel regions 39 have a matrix pattern, as shown in FIG. 6B, or a zigzag pattern, as shown in FIG. 6C, each of the p⁻-type column regions 42 may be formed in the area below the central portion of each of the p⁻-type channel regions 39 surrounded by each of the ring-shaped n-type source regions 41 so as to have a column shape extending from each of the p⁻-type channel regions 39 toward the silicon substrate 32.

On the front surface 40 of the epitaxial layer 35, there is formed a gate insulator film 45 made of, e.g., $SiO_2$ (silicon oxide). A gate electrode 46 is formed on the gate insulator film 45.

The gate electrode 46 is formed into a stripe shape to extend along the p⁻-type channel regions 39 having a stripe shape. The gate electrode 46 is opposite to, across the gate insulator film 45, a portion of each of the p⁻-type channel regions 39 exposed between the peripheral edge of each of the p⁻-type channel regions 39 and an n-type source regions 41. The gate electrode 46 is made of, e.g., polysilicon containing an impurity at a high concentration. In the event that the p⁻-type channel regions 39 have the matrix pattern as shown in FIG. 6B, the gate electrode 46 may be formed into a lattice shape so as to surround each of the p⁻-type channel regions 39.

An inter-layer insulator film 47 made of, e.g., $SiO_2$, is formed on the epitaxial layer 35 so as to cover the gate electrode 46. A contact hole 48 is formed in the inter-layer insulator film 47 and the gate insulator film 45. Each of the n-type source regions 41 and each of the p⁻-type channel regions 39 are partially exposed in the contact hole 48. A source electrode 49 is formed on the inter-layer insulator film 47. The source electrode 49 makes contact with all of the n-type source regions 41 and all of the p⁻-type channel regions 39 through the contact hole 48. In other words, the source electrode 49 serves as a common wiring line with respect to all of the unit cells. The source electrode 49 is made of a metallic material, e.g., Al (aluminum).

Figure 7A:
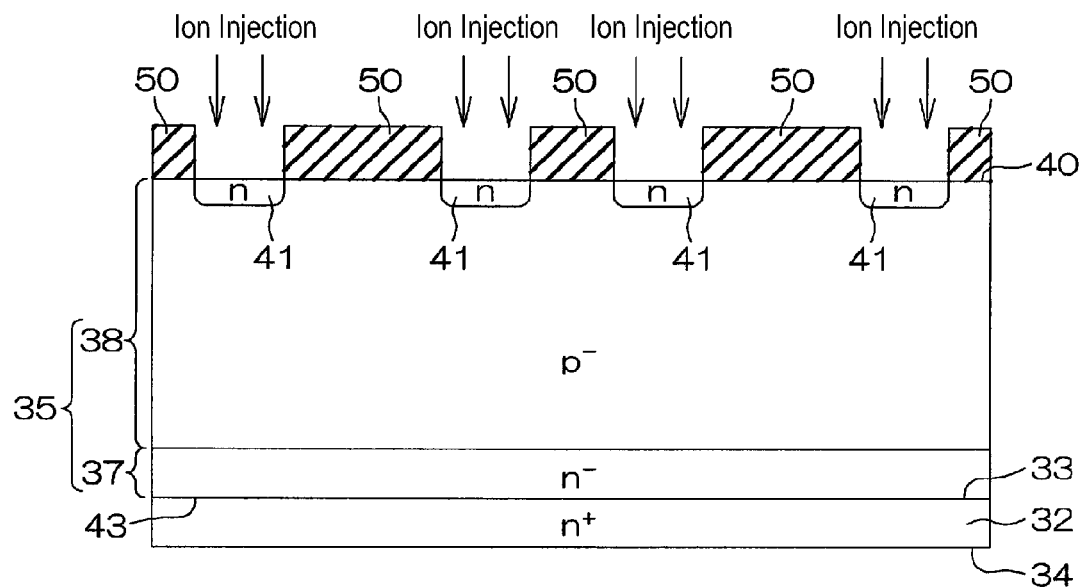
FIG. 7A is a view illustrating a step of a process for manufacturing the semiconductor device shown in FIG. 5.

FIGS. 7A through 7D are views showing steps of a process for manufacturing the semiconductor device 31 shown in FIG. 5. In order to manufacture the semiconductor device 31, as shown in FIG. 7A, Si crystals are caused to grow on the front surface 33 of the silicon substrate 32 by an epitaxial growth method such as CVD, LPE or MBE, while injecting an n-type impurity, e.g., P (phosphor). Then, the Si crystals are caused to grow while injecting a p-type impurity such as B (boron). As a result, an epitaxial layer 35 including an n⁻-type base layer 37 and a p⁻-type drift layer 38 is formed on the silicon substrate 32.

Next, a hard mask 50 is formed so as to selectively cover the portions of the epitaxial layer 35 other than the portions in which n-type source regions 41 are to be formed. Then, an n-type impurity is accelerated toward the front surface 40 of the epitaxial layer 35 exposed from the hard mask 50, thereby injecting the n-type impurity into the front surface 40 (ion injection). Subsequently, the epitaxial layer 35 is subjected to annealing at a temperature of, e.g., from 800 degrees C. to 900 degrees C. Thus, the n-type impurity injected into the front surface 40 of the epitaxial layer 35 is activated to form n-type source regions 41.

Figure 7B:
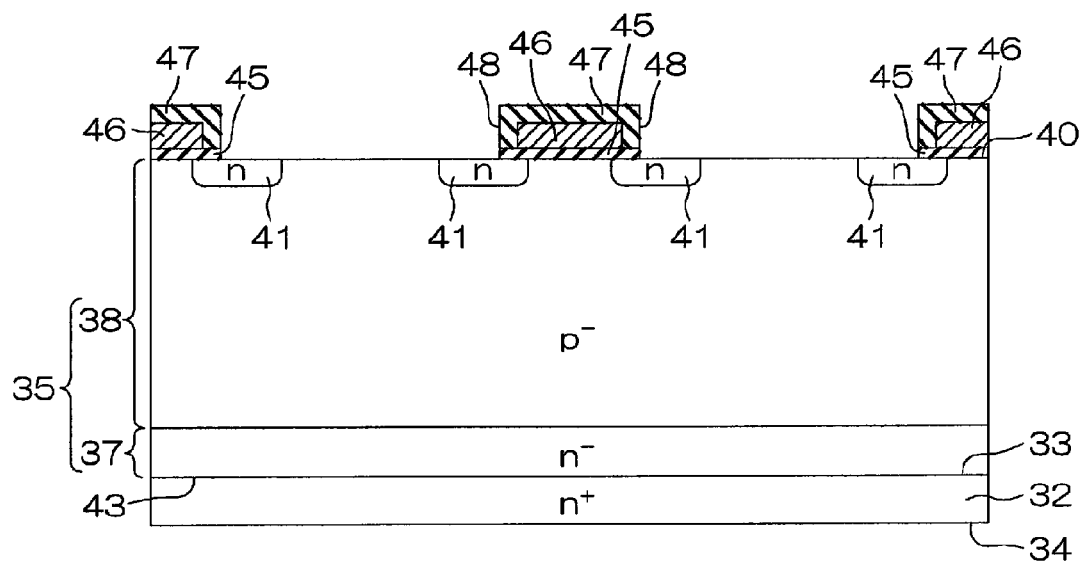
FIG. 7B is a view illustrating a step subsequent to the step shown in FIG. 7A.

Next, as shown in FIG. 7B, the front surface 40 of the epitaxial layer 35 is subjected to thermal oxidation, thereby forming a gate insulator film 45 that covers the entirety of the front surface 40 of the epitaxial layer 35. Then, polysilicon is deposited on the epitaxial layer 35 by, e.g., CVD, while injecting an impurity (any one of n-type and p-type impurities). Thereafter, unnecessary portions of the deposited polysilicon (other than the portions to become gate electrodes 46) are removed by dry etching, thereby forming gate electrodes 46.

Subsequently, an inter-layer insulator film 47 made of, e.g., $SiO_2$ is deposited on the epitaxial layer 35 by, e.g., CVD. Contact holes 48 are formed by simultaneously patterning the inter-layer insulator film 47 and the gate insulator film 45.

Figure 7C:
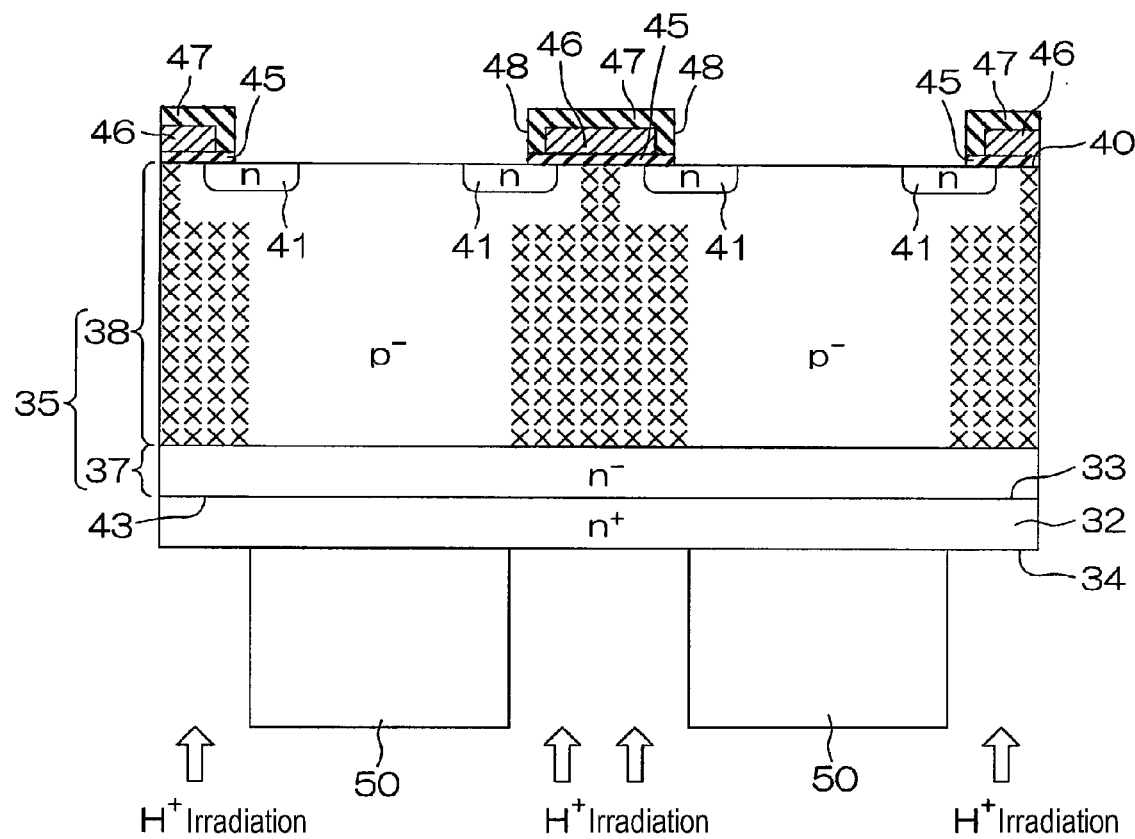
FIG. 7C is a view illustrating a step subsequent to the step shown in FIG. 7B.

Next, as shown in FIG. 7C, a thick resist mask 51 (having a thickness of, e.g., from 5 μm to 20 μm) made of a photoresist is formed on the rear surface 34 of the silicon substrate 32 so as to selectively cover the portions of the epitaxial layer 35 other than the portions in which n-type column regions 44 are to be formed. Then, $H^+$ particles are accelerated toward the rear surface 34 of the silicon substrate 32 exposed from the resist mask 51, thereby irradiating $H^+$ particles on the rear surface 34 ($H^+$ irradiation). The $H^+$ irradiation is performed in multiple stages while changing the acceleration energy of the $H^+$ particles in a step-by-step manner. For example, the $H^+$ irradiation is performed between 5 MeV and 10 MeV, while reducing the energy from a high level to a low level in a step-by-step manner (in two through five steps). This makes it possible to irradiate $H^+$ particles into the area extending from a bottom portion to a front surface portion of the epitaxial layer 35. After the $H^-$ irradiation, the thick resist mask 51 is peeled off.

Figure 7D:
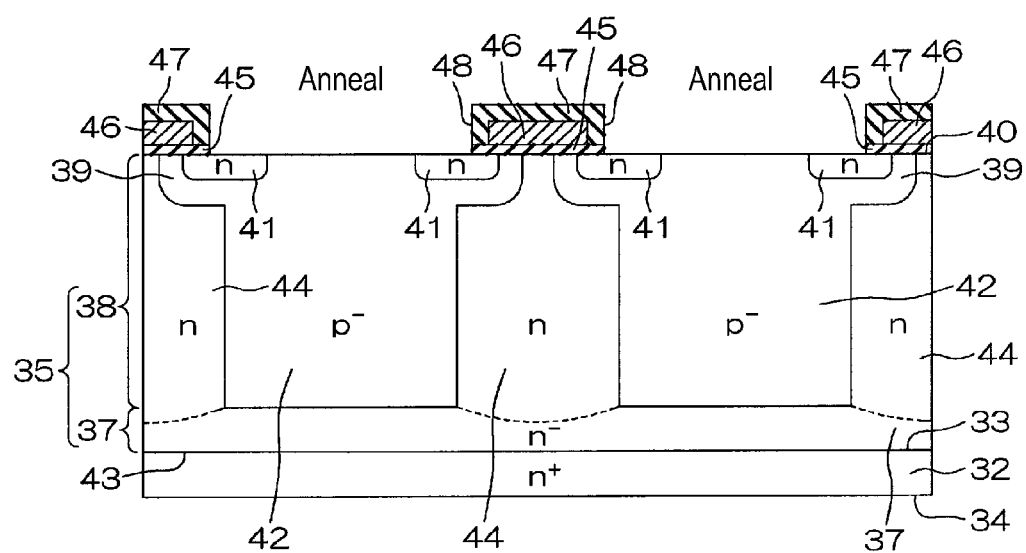
FIG. 7D is a view illustrating a step subsequent to the step shown in FIG. 7C.

Next, as shown in FIG. 7D, the epitaxial layer 35 is subjected to annealing at a temperature of, e.g., from 400 degrees C. to 450 degrees C. Thus, the $H^+$ particles included in the epitaxial layer 35 by the $H^-$ irradiation become promoters, thereby turning the oxygen atoms and holes in the epitaxial layer 35 (Si crystals) into donors. The portions irradiated with the $H^+$ particles become thermal donors exhibiting an n-type property. As a result, there are formed n-type column regions 44 made of the thermal donors. At the same time, there are formed $p^-$-type column regions 42 and $p^-$-type channel regions 39 having the same conductivity type ($p^-$-type) as that of the epitaxial layer 35.

Thereafter, a source electrode 49 is formed by depositing Al (metallic material) at a sputtering temperature of, e.g., 500 degrees C. to 600 degrees C. A drain electrode 36 is formed by depositing Au (metallic material) at a sputtering temperature of, e.g., 380 degrees C. to 450 degrees C. The semiconductor device 31 shown in FIG. 5 is obtained through the steps set forth above.

In the semiconductor device 31 (n-channel MOSFET), if a drain voltage is applied between the source electrode 49 and the drain electrode 36 (between the source and the drain) and a specified voltage is applied to the gate electrodes 46 in a state where the source electrode 49 is grounded (namely, the n-type source regions 41 are kept at 0 V), it is possible to cause an electric current to flow from the $n^-$-type base layer 37 toward the n-type source regions 41 through the n-type column regions 44 in the thickness direction of the epitaxial layer 35 (in the vertical direction).

According to the semiconductor device 31 described above, like the semiconductor device 1 of the first embodiment, there is formed a super-junction structure including the n-type column regions 44 and the $p^-$-type column regions 42. It is therefore possible to prevent local concentration of electric fields in the epitaxial layer 35, making it possible to reduce the on-resistance of the semiconductor device 31 and to increase the breakdown voltage of the semiconductor device 31.

The n-type column regions 44 are formed of thermal donors. Therefore, as compared with the related art, it is possible to form a super-junction structure in a short period of time and at low cost. Moreover, the super-junction structure can be easily incorporated into a MOSFET of basic structure without affecting the MOS structure. It is also possible to prevent variations in specific resistance among the n-type column regions 44. In addition, it is possible to easily miniaturize the n-type column regions 44, helping to miniaturize the semiconductor device 31.

The annealing for the formation of thermal donors may be performed at a temperature of from 400 degrees C. to 450 degrees C. (the step shown in FIG. 7D). This makes it possible to reduce the specific resistance of the n-type column regions 44 and to further reduce the on-resistance.

Figure 8:
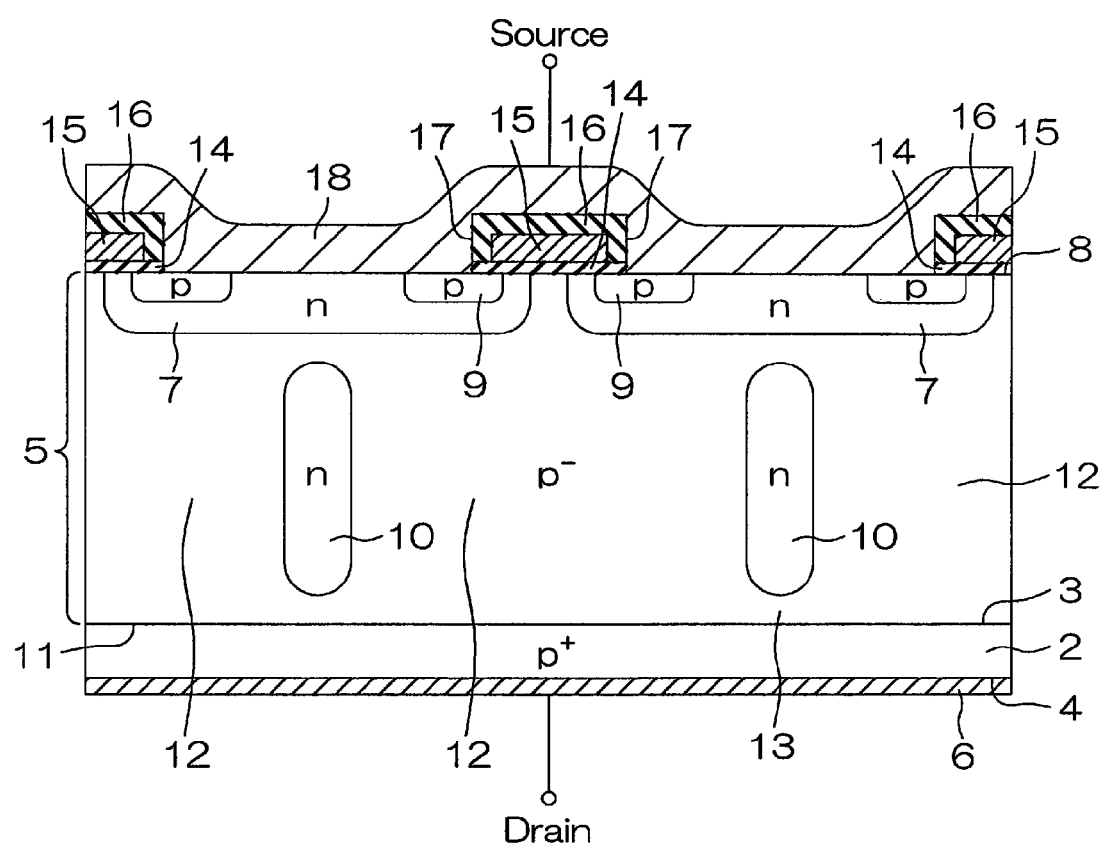
FIG. 8 is a view showing a modified example of an n-type column region of the semiconductor device shown in FIG. 1.

While certain embodiments of the present disclosure have been described above, the present disclosure may be embodied in other forms. For example, as shown in FIG. 8, the n-type column regions 10 of the semiconductor device 1 of the first embodiment may be formed in the direction of the silicon substrate 2 (in the direction of the rear surface 11 of the epitaxial layer 5) with respect to the n-type channel regions 7 in a spaced apart relationship with the n-type channel regions 7.

The features grasped from the foregoing embodiments may be employed in combination in the respective embodiments. Moreover, the components of the respective embodiments may be combined within the scope of the present disclosure. In addition, various changes in design may be made within the scope of the subject matters defined in the claims.

While certain embodiments have been described, these embodiments have been presented by way of example only, and are not intended to limit the scope of the disclosures. Indeed, the novel devices and methods described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
a p-type semiconductor layer;
n-type column regions arranged in a mutually spaced-apart relationship along a predetermined direction parallel to a front surface of the semiconductor layer, each of the n-type column regions formed of a plurality of columnar thermal donors exhibiting an n-type property;
a p-type column region of the semiconductor layer interposed between the n-type column regions adjoining to each other, the n-type column regions configured to form a super-junction structure in the semiconductor layer in cooperation with the p-type column region;
a channel region selectively formed in a front surface portion of the semiconductor layer to make up a portion of the front surface of the semiconductor layer;
a source region selectively formed in a front surface portion of the channel region to make up a portion of the front surface of the semiconductor layer, a conductivity type of the source region being opposite to that of the channel region;

a gate insulator film formed on the front surface of the semiconductor layer; and a gate electrode formed on the gate insulator film and opposite to the channel region across the gate insulator film.

2. The device of claim 1, wherein the n-type column regions have a specific resistance of from 1.0 Ω·cm to 10.0 Ω·cm.

3. The device of claim 1, wherein the channel region is an n-type and the source region is a p-type, and further comprising: a p-channel MOSFET configured to induce a channel between the p-type source region and the p-type column region by applying a voltage to the gate electrode.

4. The device of claim 3, wherein the semiconductor layer includes a p-type base region formed in a direction of a rear surface of the semiconductor layer with respect to the n-type column regions and the p-type column region so as to extend below the n-type column regions and the p-type column region along the predetermined direction parallel to the front surface of the semiconductor layer.

5. The device of claim 1, wherein the channel region is a p-type and the source region is an n-type, and further comprising: an n-channel MOSFET configured to induce a channel between the n-type source region and the n-type column regions by applying a voltage to the gate electrode.

6. The device of claim 5, wherein the semiconductor layer includes an n-type base region formed in a direction of a rear surface of the semiconductor layer with respect to the n-type column region and the p-type column region so as to extend below the n-type column regions and the p-type column region along the predetermined direction parallel to the front surface of the semiconductor layer.

7. The device of claim 1, wherein the n-type column regions make contact with the channel region.

8. The device of claim 1, wherein the n-type column regions are formed in a spaced-apart relationship with the channel region.

* * * * *